(12) United States Patent
Edwards et al.

(10) Patent No.: US 7,746,699 B1
(45) Date of Patent: Jun. 29, 2010

(54) NON-VOLATILE MEMORY READ-CHECK

(75) Inventors: Eric E. Edwards, Albuquerque, NM (US); Schuyler E. Shimanek, Albuquerque, NM (US); Thomas J. Davies, Jr., Albuquerque, NM (US); Shankar Lakkapragada, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 134 days.

(21) Appl. No.: 12/208,454

(22) Filed: Sep. 11, 2008

(51) Int. Cl.
*G11C 16/04* (2006.01)
(52) U.S. Cl. .............................. 365/185.18; 365/189.07; 365/185.33; 365/185.09
(58) Field of Classification Search ............ 365/185.18, 365/189.07, 185.33, 185.09, 185.22, 189.05
See application file for complete search history.

(56) References Cited

U.S. PATENT DOCUMENTS 7,679,961 B2 * 3/2010 Lee et al. ............... 365/185.19

* cited by examiner

*Primary Examiner*—David Lam
(74) *Attorney, Agent, or Firm*—Scott Hewett

(57) ABSTRACT

An integrated circuit system (120) includes a memory array (122) storing a configuration data set to configure an integrated circuit. The integrated circuit (121) includes a configuration memory (128) and a configuration controller state machine (126). The configuration controller state machine operates so as to read a read-check signature at a read-check address of the memory array (122) and to compare the read-check signature with a standard signature stored in the integrated circuit (121). If the read-check signature passes the comparison, the configuration controller state machine (126) loads the configuration data set from the memory array to the configuration memory (128) of the integrated circuit.

20 Claims, 6 Drawing Sheets

US 7,746,699 B1

NON-VOLATILE MEMORY READ-CHECK

FIELD OF THE INVENTION

This invention relates generally to integrated circuits, and more particularly to techniques for determining whether a non-volatile memory can be reliably read.

BACKGROUND OF THE INVENTION

Many integrated circuits ("ICs") are made up of millions of interconnected devices, such as transistors, resistors, capacitors, and diodes, on a single chip of semiconductor substrate. Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks, also known as Block RAM, (BRAM), multipliers, digital signal processing blocks (DSPs), processors, clock managers, delay lock loops (DLLs), and so forth.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

Configurable logic devices, such as CPLDs and FPGAs, are configured to a particular application(s) by loading configuration data from a memory, typically at power-up. The configuration data may be read from memory (e.g., from an external PROM) or written into the FPGA by an external device. The configuration data is read from a ROM, PROM, EPROM, optical disk, magnetic disk, or other suitable source ("configuration source"). In CPLDs, configuration data is typically stored on-chip in non-volatile memory. Various techniques have been developed for ensuring that the configuration data accurately configures the device. One approach is to use a cyclical redundancy check ("CRC"), which is done after the entire set of configuration data has been loaded, to check whether the data was correctly transferred. In a CRC technique, a signature at the end of the configuration sequence is READ and compared with an expected signature. This approach is suitable for highly reliable configuration sources and READ techniques, or for relatively short sets of configuration data; however, in large configurable logic devices, such as an FPGA, it is undesirable to load a large set of configuration data, only to find that the configuration is not valid. The CRC can be used to validate data coming from configuration memory. It can also be used in a process where the SRAM in the PLD is readback and validated.

Another technique used to validate configuration data involves using a multiple input signature register ("MISR"). Using a MISR technique, a signature at the end of the configuration sequence is read and compared with an expected signature. The signature is accumulated as data is read from the configuration source, so the signature provides a valid indication of the integrity of the configuration data. However, the MISR technique uses the entire configuration data set, which can take a considerable time to download for some FPGAs. The MISR can be used to validate data coming from configuration memory. It can also be used in a process where the SRAM in the PLD is readback and validated.

A technique called "T-bits" has been developed for checking configuration integrity of CPLDs. A T-bit technique uses two bits of read-check data for each data address. The two bits are checked to see if they read the correct values as configuration proceeds. T-bit data is mixed into the bitstream, which is acceptable for relatively simple configuration data sets, but for larger configuration data sets, it can consume an unreasonable proportion of the memory.

Techniques for reliably and efficiently configuring FPGAs and other programmable logic devices are desired.

SUMMARY OF THE INVENTION

An integrated circuit system includes a memory array storing a configuration data set. An IC includes a configuration memory and a configuration controller state machine. The configuration controller state machine operates so as to read a read-check signature at a read-check address of the memory array and to compare the read-check signature with a standard signature stored in the IC. If the read-check signature passes the comparison, the configuration controller state machine loads the configuration data set from the memory array to the configuration memory of the IC.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1A:
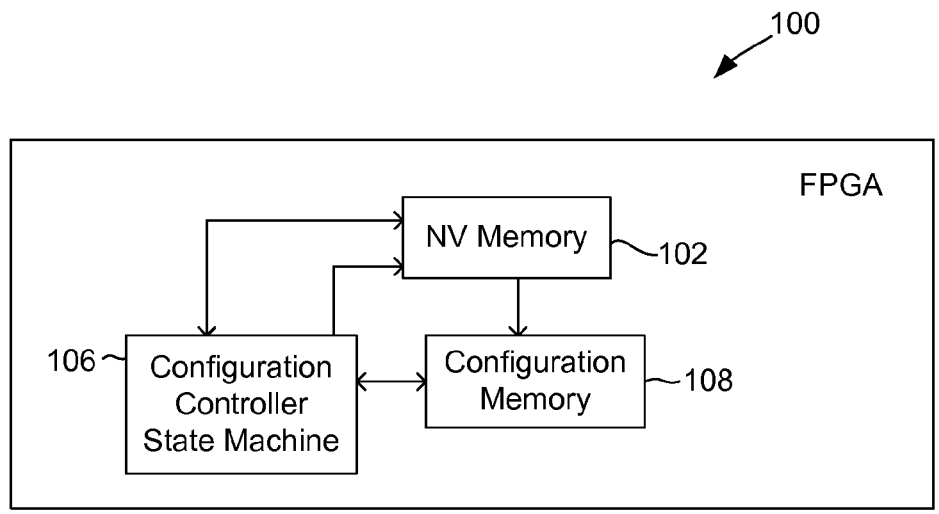
FIG. 1A is a block diagram of an exemplary embodiment of an FPGA with internal Non-volatile ("NV") memory in accordance with one or more aspects of the invention.

FIG. 1A is a block diagram of an exemplary embodiment of an IC (FPGA) system 100 with internal NV memory 102 in accordance with one or more aspects of the invention. As used herein, "NV" refers to programmable/erasable non-volatile memory, as opposed to read-only memory such as ROM, which is typically programmed in a permanent fashion and generally highly robust in reading. In a particular embodiment, the NV memory is flash memory. In an alternative embodiment, the NV memory is EEPROM. NV that can be incorporated fairly easily into a CMOS IC fabrication sequence is particularly desirable for on-chip NV memory. However, NV can be more difficult to read than other types of memory, such as ROM, because of the sensitivity of NV memory to process, voltage, and temperature ("PVT") variations.

When the FPGA is powered-up, a power on reset ("POR") signal is generated. A state machine 104 in the FPGA sends an address to the NV memory 102 that contains a read-check signature, which is a bit string (ones and zeros) of a selected size, typically between about 8 bits and about 64 bits. The size of the read-check signature is selected to provide a statistically valid number of bits that are read to check whether the NV memory 102 is providing valid data. In an exemplary embodiment, a read-check signature is a 64-bit signature. In another embodiment, the read-check signature is a 32-bit signature. The read-check signature is compared against a standard signature in the configuration controller state machine 106 or elsewhere in the FPGA. In a particular embodiment, the standard signature is hard-wired in the configuration controller state machine 106. That is, the configuration controller state machine 106 has logic gates wired to give the same bit string as the read-check signature. In an alternative embodiment, the standard signature is burned in one-time programmable ("OTP") memory or is stored in ROM.

If the read-check signature is valid (i.e., is the same as the standard signature), it indicates with high probability that the NV memory is being correctly read (e.g., a one-in-$2^{64}$ chance of having bad data for a 64-bit read-check signature). It is desirable for the read-check signature to include both logical ones and logical zeros to insure each data state is being accurately read from the NV memory. If one data state is more problematic than the other, the read-check signature may have more bits in the less reliable state. In a particular embodiment, if the read-check signature does not match the stored signature, the sequence repeats until a match is obtained or a maximum number of tries is reached and an error signal is generated (see, e.g., FIG. 2B).

In some embodiments, once a match is obtained, the read-check signature is read again and compared again to the standard signature to insure the NV memory is stable. For example, voltages at supply or ground nodes in the IC might be unstable or noisy during power-up. Reading the read-check signature a number of times (e.g., about 16 times to about 1000 times) to confirm accurate and repeatable reading of the NV memory increases the probability that the configuration data will be reliably read. In other embodiments, the configuration controller state machine 106 proceeds with reading the configuration data from the NV memory 102 into the configuration memory (typically SRAM) 108 when the read-check signature matches the standard signature.

A CRC or other error-checking technique can be used on the configuration data to ensure it has been read accurately, or a MISR or SEU check can be used to check the configuration memory after it has been written to SRAM on the PLD. In other words, a signature read-back check can be used by itself, or in conjunction with conventional memory checks that occur during configuration. Using a read-check signature technique increases the likelihood that the configuration data is accurately read because it increases the likelihood that the NV memory is ready. The relatively small size of the read-check signature allows a quick check that the power supply levels are suitably stable after a POR signal to continue reading the configuration data. It also saves configuration time compared to techniques that rely on loading the entire configuration data set.

Figure 1B:
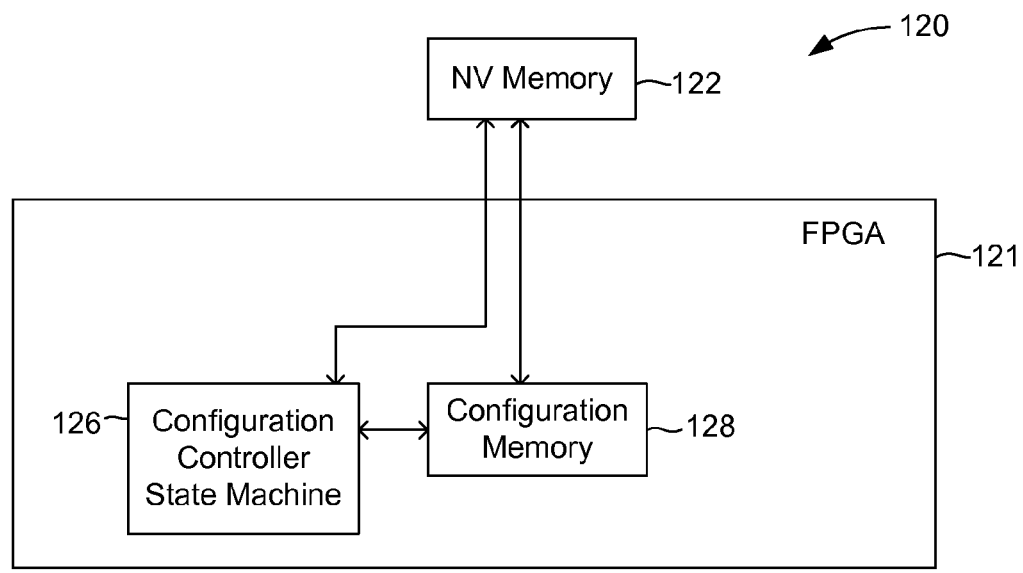
FIG. 1B is a block diagram of an exemplary embodiment of an FPGA system with an external NV memory in accordance with one or more aspects of the invention.

FIG. 1B is a block diagram of an exemplary embodiment of an FPGA system 120 with an external NV memory 122 in accordance with one or more aspects of the invention. As described above in reference to FIG. 1A, a configuration controller state machine 126 in the FPGA 121 sends a selected address to the NV memory that contains the read-check signature, reads the read-check signature, and compares the read-check signature with a standard signature. The NV memory 122 is flash memory or other type of memory. In a particular embodiment, the NV memory is a type of memory that is fabricated using materials and processing that is not typically part of a CMOS IC fabrication sequence, such as flash memory or EEPROM memory. The ability of the READ circuitry to read the NV memory correctly, which may be affected by conditions in the NV memory or READ circuitry, is verified to insure the configuration data will be accurately read.

Once the conditions of the configuration controller state machine 126 are satisfied, the configuration controller state machine 126 starts loading the configuration data from the NV memory 122 into configuration memory 128, which is typically SRAM, and configuration of the FPGA continues. In a particular embodiment, the NV signature address is the first address read. If the signature passes, configuration continues on with the next address. The data contained in the read-check signature is arbitrary (i.e., is not used as part of the configuration data, but rather for verification against a standard), it is ignored by the configuration controller after verification.

Figures 2A, 2B:
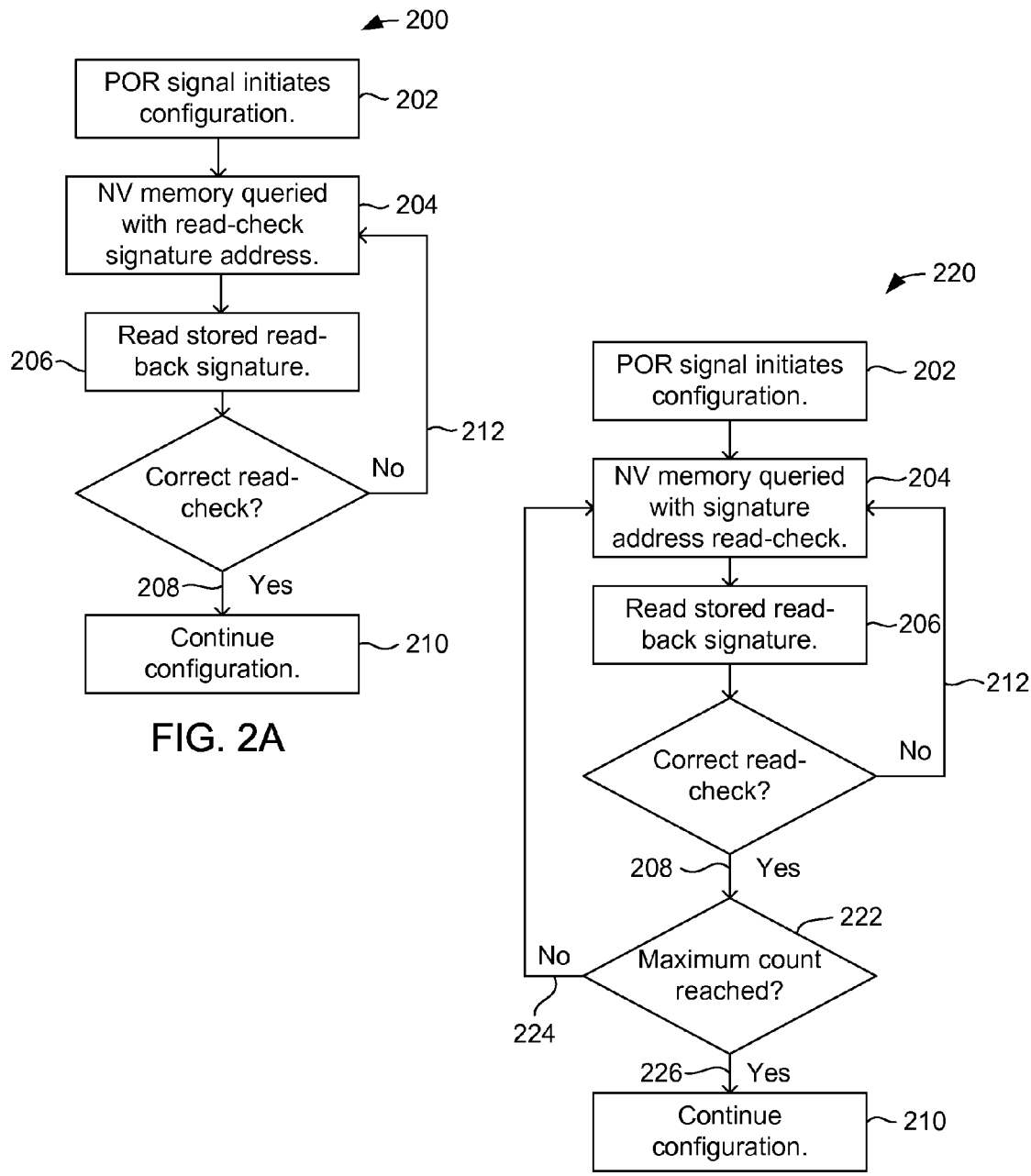
FIG. 2A is a flow chart of a method of configuring a programmable logic device according to an embodiment.
FIG. 2B is a flow chart of a method of configuring a programmable logic device using multiple read-checks according to another embodiment.

FIG. 2A is a flow chart of a method 200 of configuring an IC according to an embodiment of the present invention. A POR signal initiates the configuration process (step 202). In an exemplary embodiment, the POR signal originates from the configuration circuitry when the voltage supplies are high enough to begin configuration. However, the supply levels may be noisy or bounce, or the READ circuitry may not be ready, either of which could affect accurate reading of the configuration data. NV memory is queried with a read-check signature address (step 204) and a read-check signature is read from the NV memory (step 206). The read-check signature is compared to a standard signature and, if the correct value of the read-check signature was read (i.e., if the read-check signature is valid) (branch 208), configuration of the IC continues (step 210).

If the read-check signature is not correct (branch 212), the NV memory is queried again and the read-check process is repeated. Only a relatively small number of bits of the total NV memory are checked, which can occur quite rapidly, even if they are checked over and over again. In a further embodiment, an NV check is performed again after a portion of configuration data has been read, typically if the configuration process is long, to ensure that the NV READ is still functioning properly. In a particular embodiment, read-check signatures are periodically stored within the configuration data. In an alternative embodiment, such as a configuration process that does not include a CRC or MISR check, another NV check is automatically done after the configuration data has been read.

In a particular embodiment, the NV memory is flash memory. In a further embodiment, the NV memory is flash memory incorporated in the IC. In a particular embodiment, the IC is an FPGA including a state machine that queries the NV memory and the standard signature is hard-wired in the IC. In a further embodiment, the state machine has additional functionality, such as a maximum failure limit (not shown, see, e.g., FIG. 2C), time-out, or other control limits to avoid getting stuck in a loop.

FIG. 2B is a flow chart of a method 220 of configuring an IC using multiple read-checks according to another embodiment. A POR signal initiates the configuration process (step 202). NV memory is queried with a read-check signature address (step 204) and a read-check signature is read from the NV memory (step 206). The read-check signature is compared to a standard signature and, if the read-check signature is not correct (branch 212), the NV memory is queried again and the read-check process is repeated.

If the correct value of the read-check signature was read (branch 208), a correct read count is incremented and compared to a maximum correct read count (decision 222) and, if the correct read count is less than the maximum correct read count (branch 224), the process returns to step 204 until the correct read count equals the maximum correct read count (branch 226), and configuration of the IC continues (step 210).

For example, the initial correct count value in decision 222 is zero. Each time the read-check signature is correctly read from the NV memory, the count value is incremented and checked against the maximum correct read count value, which is typically between about 2 and about 1000. Checking for a valid read-check signature multiple times before beginning the configuration data loading helps to ensure that the power supplied to the NV memory and IC are suitably stable. For example, if a valid read-check signature was read at a high point of a power supply bounce, the configuration data might be corrupted if loading started immediately and the supply voltage dipped below the level necessary for accurately reading the NV memory. The maximum correct read count value is selected to provide a stable NV read environment, which may depend in turn on the system that the IC and NV memory are operating in. In a particular embodiment, the maximum correct read count value is user selectable and changeable in an FPGA system. In other words, the user can specify the maximum correct read count value and change it to optimize operation of the FPGA system. In a further embodiment, an incorrect read-check signature (branch 212) resets the correct count value (typically to zero, but other values are alternatively selected) (steps not separately shown).

Figure 2C:
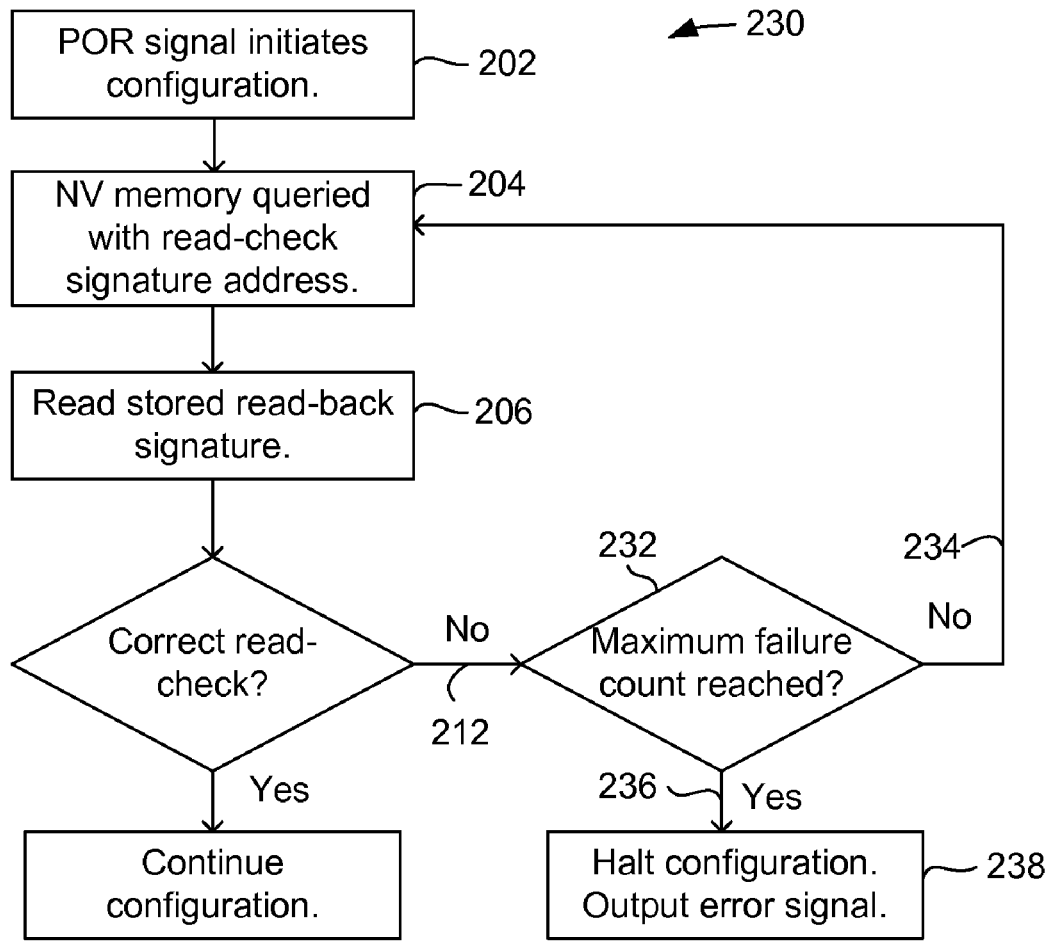
FIG. 2C is a flow chart of a method of configuring a programmable logic device including a failure branch according to another embodiment.

FIG. 2C is a flow chart of a method 230 of configuring an integrated circuit including a failure branch according to another embodiment. A POR signal initiates the configuration process (step 202). NV memory is queried with a read-check signature address (step 204) and a read-check signature is read from the NV memory (step 206). The read-check signature is compared to a standard signature and, if the read-check signature is not correct (branch 212), a failed read count is incremented and compared to a maximum failed read count value (decision 232) and, if the failed read count is less than the maximum failed read count value (branch 234), the process returns to step 204 until the failed read count equals the maximum failed read count value (branch 236), at which point configuration is halted and an error signal is output (step 238).

Figure 2D:
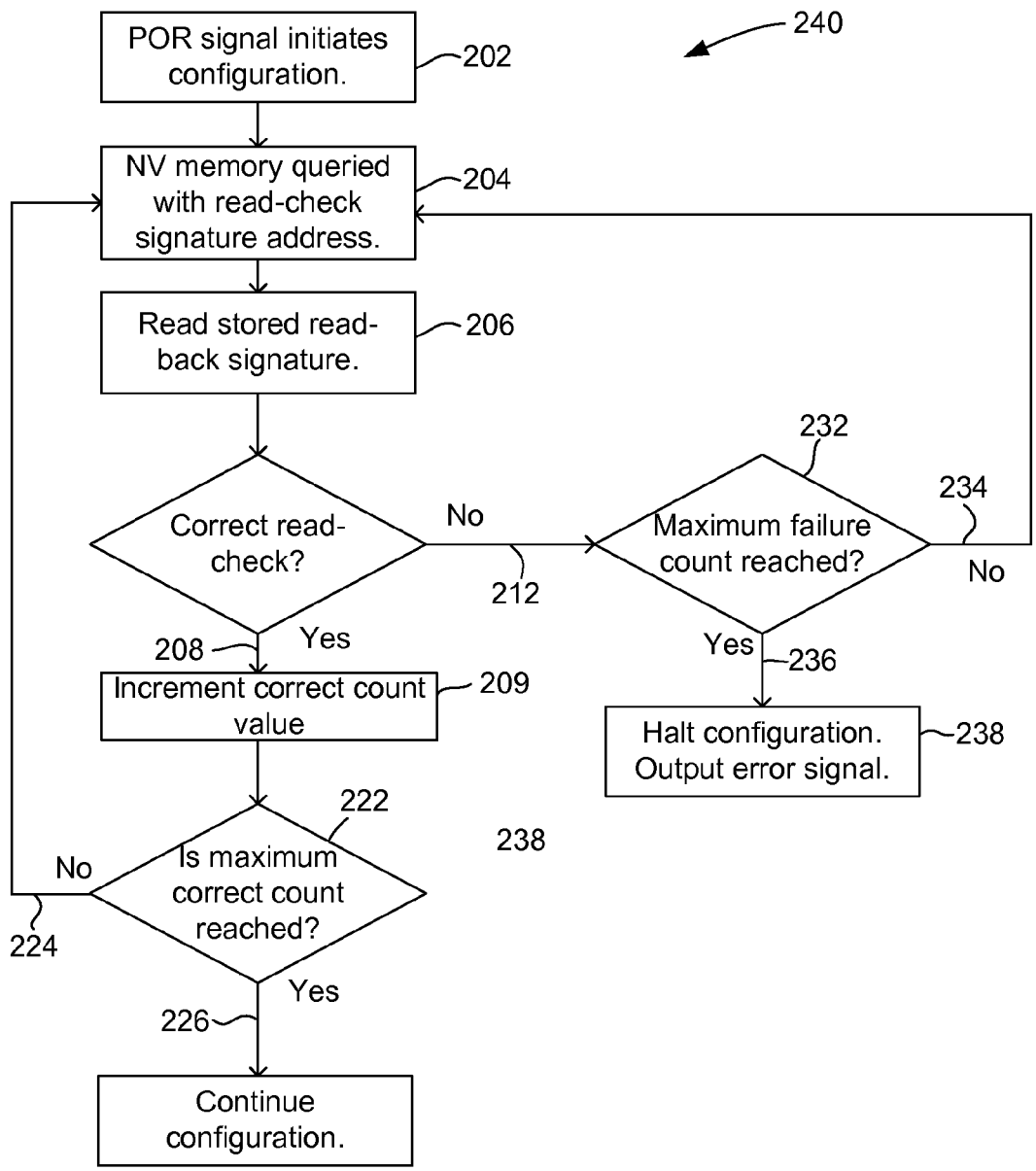
FIG. 2D is a flow chart of a method of configuring a programmable logic device using multiple read-checks and including a failure branch according to an embodiment.

FIG. 2D is a flow chart of a method 240 of configuring an IC using multiple read-checks and including a failure branch according to an embodiment. A POR signal initiates the configuration process (step 202). NV memory is queried with a read-back signature address (step 204) and a read-back signature is read from the NV memory (step 206). The read-back signature is compared to a standard signature and, if the read-back signature is not correct (branch 212), a failed read count is incremented and compared to a maximum failed read count (decision 232) and, if the failed read count is less than the maximum failed read count (branch 234), the process returns to step 204 until the failed read count equals the maximum failed read count (branch 236), at which point configuration is halted and an error signal is output (step 238), or until a correct read-back signature occurs (branch 208).

If the correct value of the read-back signature was read (branch 208), a correct read count is incremented and compared to a maximum correct read count (decision 222) and, if the correct read count is less than the maximum correct read count (branch 224), the process returns to step 204 until the correct read count equals the maximum correct read count (branch 226), and configuration of the IC continues (step 210).

Figure 2E:
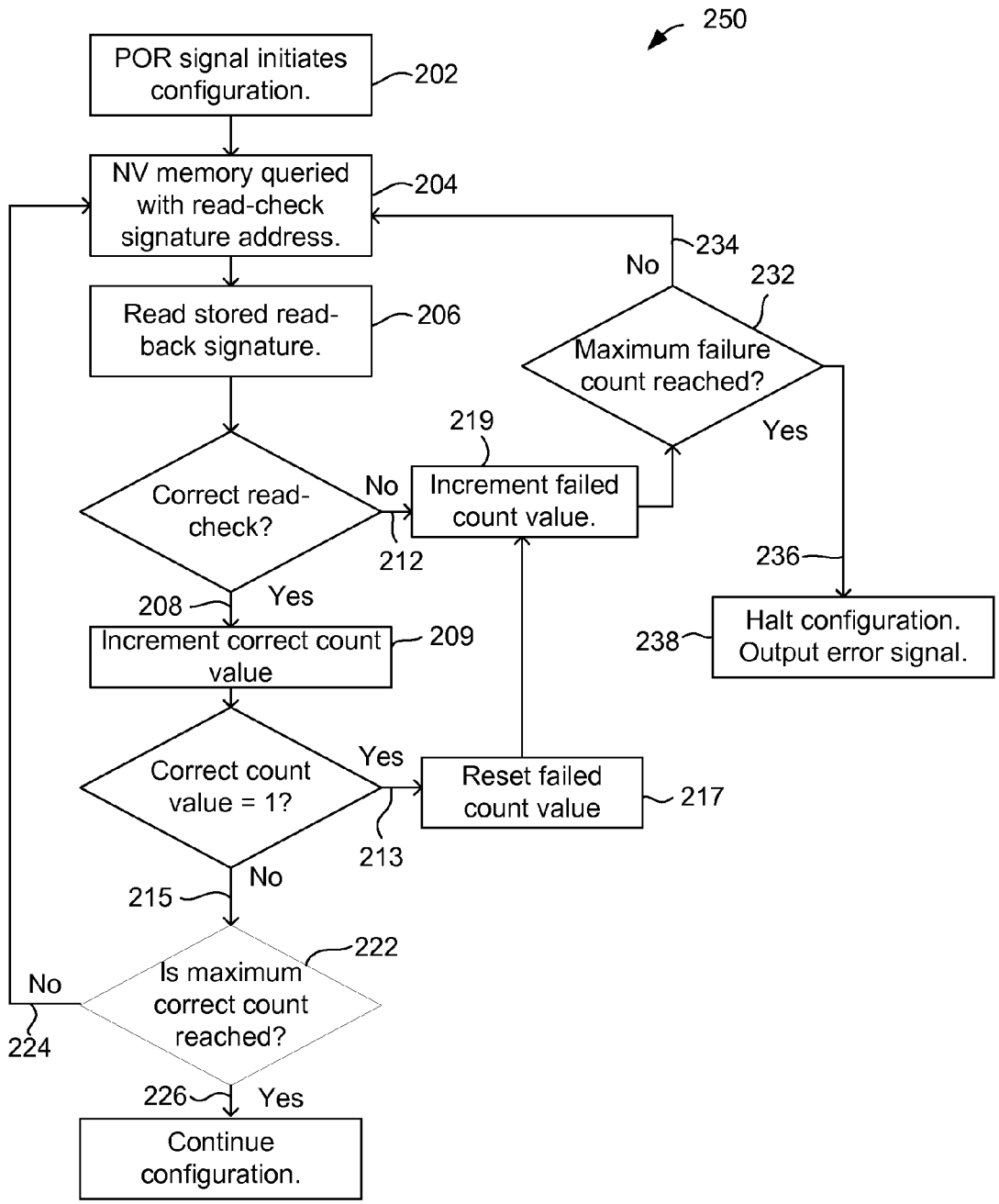
FIG. 2E is a flow chart of a method of configuring a programmable logic device using multiple read-checks and including a one-time count reset according to an embodiment.

FIG. 2E is a flow chart of a method 250 of configuring a programmable logic device using multiple read-checks and including a one-time count reset according to an embodiment. A POR signal initiates the configuration process (step 202). NV memory is queried with a read-check signature address (step 204) and a read-check signature is read from the NV memory (step 206). The read-check signature is compared to a standard signature and, if the read-check signature is not correct (branch 212), a failed read count is incremented (step 219) and compared to a maximum failed read count (decision 232) and, if the failed read count is less than the maximum failed read count (branch 234), the process returns to step 204 until the failed read count equals the maximum failed read count (branch 236), at which point configuration is halted and an error signal is output (step 238).

If the read-check signature is valid (i.e., equals the standard signature) (branch 208), the correct count value is incremented (step 209). If the correct count value equals 1 (branch 213) (i.e., on the first correct read), the failed count value is (optionally) reset (step 217) (typically to zero). This branch allows the failed readings occurring before the first valid reading to be ignored. This is desirable because the verification process will often have a large number of failed readings before the first valid reading, and this branch allows a one-time reset so that these preliminary failures are not counted, while insuring that subsequent failures are counted. In a yet further embodiment, step 217 both resets the failed count value and resets the maximum failure count. For example, a high number of failures might be tolerable at the beginning of the verification process, but after the first correct reading, a smaller number of failures will halt the operation.

After the first correct read, subsequent correct reads proceed through branch 215. If the correct read count is less than the maximum correct read count value (branch 224), the process returns to step 204 until the correct read count equals the maximum correct read count value (branch 226), and configuration of the IC continues (step 210).

Figure 3:
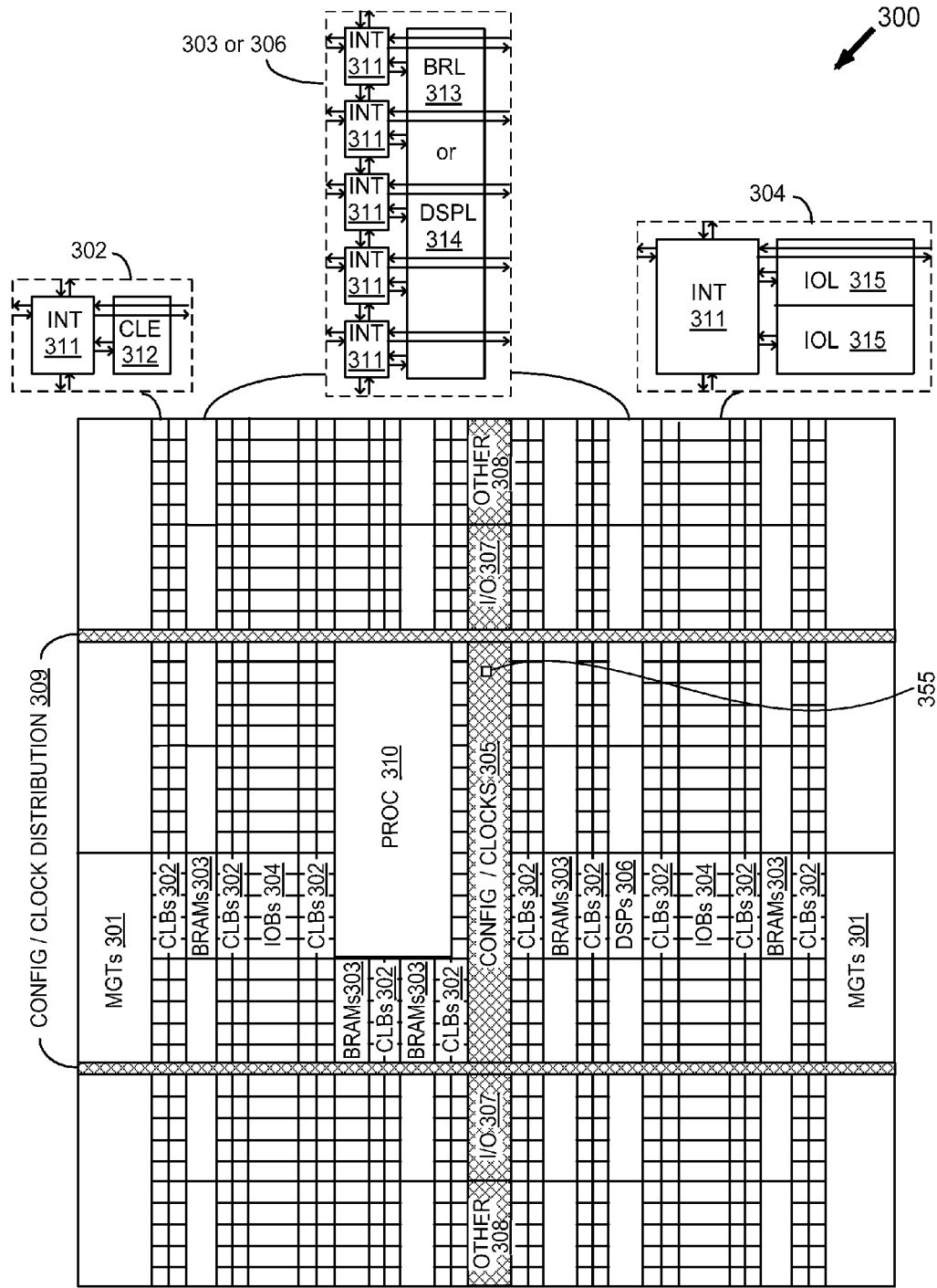
FIG. 3 is a plan view of an FPGA including a read-check circuit according to an embodiment.

FIG. 3 is a plan view of an FPGA 300 including a read-check circuit 302 according to an embodiment. The FPGA 300 includes CMOS portions in several of the functional blocks, such as in RAM and logic, and is fabricated using a CMOS fabrication process. One or more state machines 355 according to one or more embodiments is incorporated into the FPGA 300. In a particular embodiment, the state machine 355 is included in a configuration block 305 of the FPGA. A state machine according to an embodiment is alternatively incorporated into a different block of the FPGA; however, the configuration block 305 will always be active during configuration and including the state machine in the configuration block avoids having to activate a second block. Additionally, placing the state machine 355 in the configuration block 305 insures that these components are in close physical proximity, which facilitates cooperation. In a particular embodiment, the standard signature is hard-wired in the state machine 355 or elsewhere in the configuration block 305 as a plurality of logic gates, each of which outputs a selected logic value according to the expected read-check signature.

The FPGA architecture includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 are manufactured using metal layered above the various illustrated logic blocks, and typically are not confined to the area of the input/output logic element 315. In the pictured embodiment, a columnar area near the center of the die (shown shaded in FIG. 3) is used for configuration, clock, and other control logic.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps unless otherwise indicated.

What is claimed is:

1. An integrated circuit system comprising:
 a memory array storing a configuration data set;
 a configuration memory in an integrated circuit; and
 a configuration controller state machine in the IC operating so as to read a read-check signature at a read-check address of the memory array, and to compare the read-check signature to a standard signature stored in the integrated circuit, and, if the read-check signature passes the comparison, to load the configuration data set from the memory array to the configuration memory.

2. The integrated circuit system of claim 1 wherein the memory array comprises non-volatile memory.

3. The integrated circuit system of claim 2 wherein the non-volatile memory comprises flash memory.

4. The integrated circuit system of claim 3 wherein the flash memory is incorporated in the integrated circuit.

5. The integrated circuit system of claim 1 wherein the integrated circuit is a field-programmable gate array ("FPGA") and the state machine is incorporated in a configuration block of the FPGA.

6. The integrated circuit of claim 1 wherein the standard signature is hard-wired in the integrated circuit.

7. The integrated circuit system of claim 1 wherein the standard signature is stored in a plurality of one-time programmable fuses in the integrated circuit.

8. The integrated circuit system of claim 1 wherein the state machine further operates so as to perform a second read and compare of the read-check signature before loading the configuration data set from the memory array to the configuration memory.

9. The integrated circuit system of claim 8 wherein the state machine further operates to produce a correct count value and to not load the configuration data set from the memory array to the configuration memory until the correct count value reaches a maximum correct count value.

10. The integrated circuit system of claim 8 wherein the state machine further operates to produce a failed count value, and then to produce a an error signal, and to halt operation before loading the configuration data set when the failed count value reaches a maximum failed count value.

11. A method of configuring an integrated circuit comprising:
 initiating configuration in response to a power-on reset signal; then
 querying a read-check signature address in a non-volatile memory;
 reading a read-check signature from the non-volatile memory to provide a first read-check signature;
 comparing the first read-check signature to a standard signature stored in the integrated circuit;
 if the first read-check signature is valid, reading configuration data from the non-volatile memory; and
 loading the configuration data to the integrated circuit.

12. The method of claim 11 further comprising, after the step of reading configuration data, performing a check of the configuration data received from the non-volatile memory.

13. The method of claim 11 further comprising, after the step of loading the configuration data, performing an SRAM read-check on the configuration data loaded into the integrated circuit.

14. The method of claim 11 further comprising steps, after the step of comparing the first read-check signature to the standard signature, if the first read-check signature is not valid, repeating the steps of reading the stored read-check signature from the memory to provide a next read-check signature and comparing the next read-check signature to the standard signature until the next read-check signature is valid.

15. The method of claim 11 further comprising steps, after the step of comparing the first read-check signature to the standard signature and before the step of reading the configuration bit stream, repeating the steps of reading the stored read-check signature to provide a next read-check signature and comparing the next read-check signature to the standard signature, and, if the next read-check signature is valid, incrementing a correct read count until the correct read count equals a maximum correct read count.

16. The method of claim 15 further comprising a step, after the step of incrementing the correct read count, if any next read-check signature is invalid, of resetting the correct read count.

17. The method of claim 15 wherein the integrated circuit is a field-programmable gate array and further comprising a step, before the step of querying the read-check signature address, of setting the maximum correct read count to a user-selected value.

18. The method of claim 11 further comprising steps, after the step of comparing the first read-check signature to the standard signature, if the first read-check signature is not valid, incrementing a failed count value, repeating the steps of reading the stored read-check signature from the memory to provide a next read-check signature and comparing the next read-check signature to the standard signature and incrementing the failed count value until the failed count value reaches a maximum failure count, and then halting configuration.

19. The method of claim 18 further comprising, after incrementing the failed count value but before reaching the maximum failed count value, if any read-check signature is a first correct read-check signature, setting the failed count value and incrementing the correct read count.

20. The method of claim 19 wherein the step of setting the failed count value comprises resetting the failed count value to an initial failed count value.

* * * * *